United States Patent [19]

Kobayashi et al.

[11] 4,166,923
[45] Sep. 4, 1979

[54] AMPLITUDE- AND PERIODIC PHASE-MODULATION TRANSMISSION SYSTEM

[75] Inventors: Kazuo Kobayashi; Kiyohiro Yuki, both of Tokyo; Yutaka Suzuki, Tokorozawa, all of Japan

[73] Assignee: Nippon Telegraph & Telephone Public Corporation, Tokyo, Japan

[21] Appl. No.: 596,539

[22] Filed: Jul. 16, 1975

[30] Foreign Application Priority Data

Jul. 19, 1974 [JP] Japan .................................. 49-83576
Apr. 12, 1975 [JP] Japan .................................. 50-44999

[51] Int. Cl.$^2$ .......................................... H04L 27/24
[52] U.S. Cl. .................................. 178/67; 178/66 R; 332/17; 332/41
[58] Field of Search ................ 178/66 R, 67; 332/17, 332/41; 325/30, 45, 47, 34, 139, 163, 61, 40, 320; 179/15 BM, 15 AW; 358/84

[56] References Cited

U.S. PATENT DOCUMENTS

| 3,341,776 | 9/1967 | Doelz et al. | 178/67 |
| 3,412,206 | 11/1968 | Bizet et al. | 178/67 |
| 3,486,117 | 12/1969 | Groves et al. | 325/139 |
| 3,497,618 | 2/1970 | Thayer | 178/67 |
| 3,524,023 | 8/1970 | Whang | 178/67 |
| 3,564,412 | 2/1971 | Whang et al. | 178/67 |
| 3,619,503 | 11/1971 | Ragsdale | 178/66 R |
| 3,643,023 | 2/1972 | Ragsdale et al. | 178/67 |
| 3,706,945 | 12/1972 | Yanagidaira et al. | 332/17 |
| 3,715,474 | 2/1973 | Calfee et al. | 332/17 |
| 3,943,285 | 3/1976 | Ragsdale et al. | 178/67 |

Primary Examiner—John W. Caldwell, Sr.
Assistant Examiner—James J. Groody
Attorney, Agent, or Firm—Sughrue, Rothwell, Mion, Zinn and Macpeak

[57] ABSTRACT

A carrier is amplitude modulated in an amplitude modulator by a train of unipolar signals which alternately assume a definite voltage level and an arbitrary amplitude of one polarity. Either the carrier before it is modulated or the modulated carrier is phase modulated by the train of unipolar signals. The phase modulation takes place cyclically in that modulated carrier assumes one of predetermined N discrete phases for each occurrence of the unipolar signals. On the receiving side, the received signal is subjected to an envelope detection to extract envelope information.

10 Claims, 46 Drawing Figures

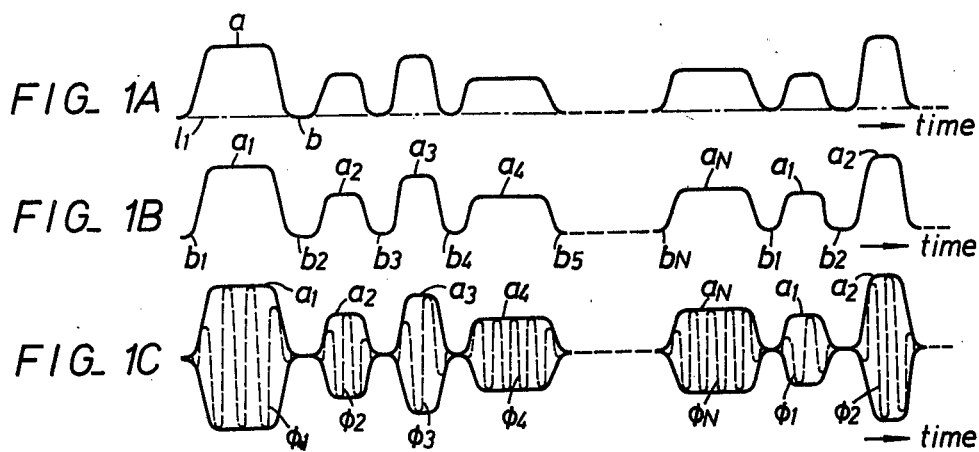
FIG. 1A
FIG. 1B
FIG. 1C
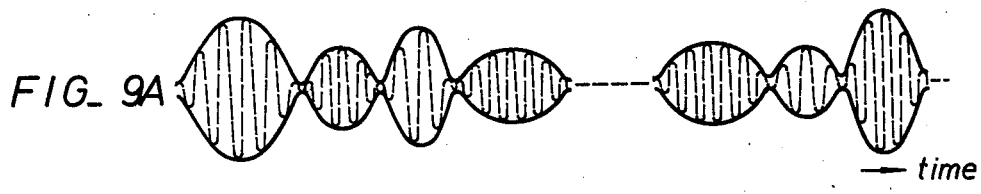
FIG. 9A
FIG. 9B
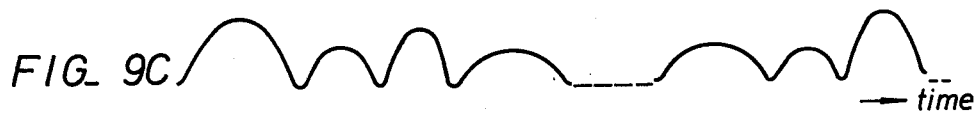
FIG. 9C
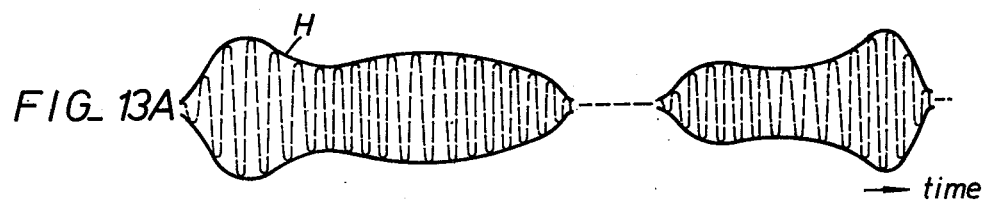
FIG. 13A
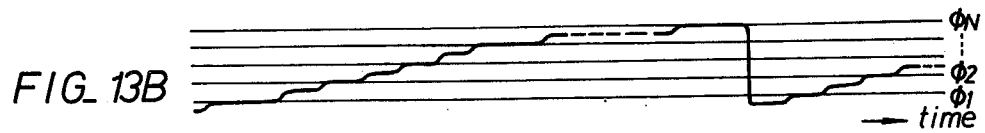
FIG. 13B
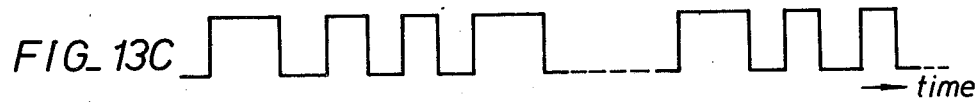
FIG. 13C
FIG. 13D

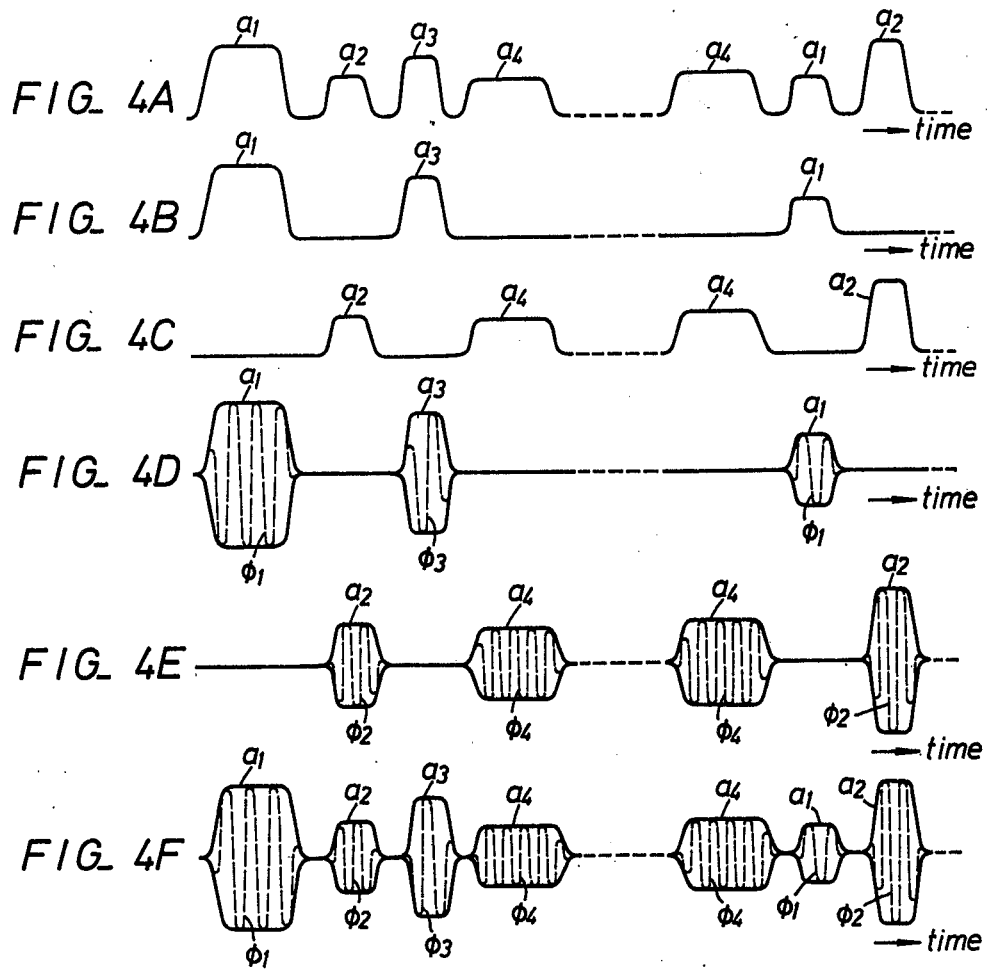
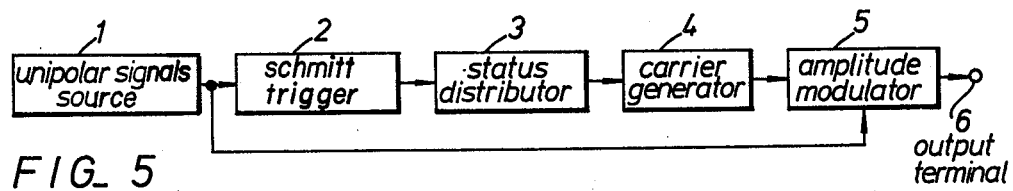
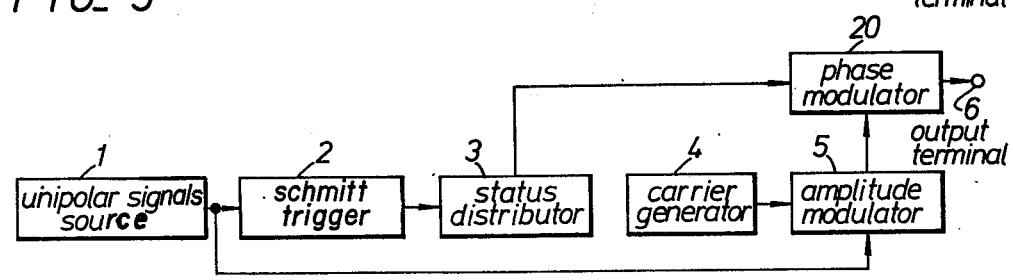

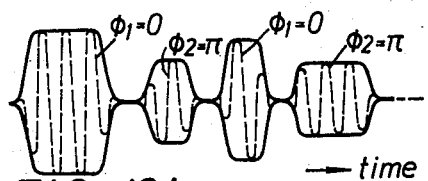
FIG. 12A
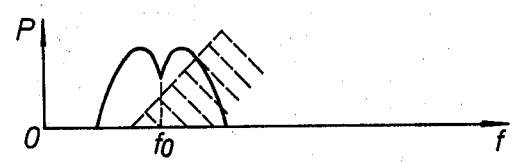
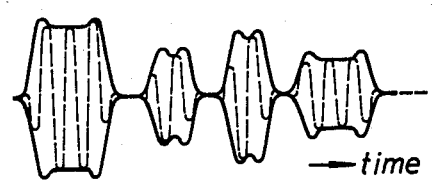
FIG. 12B
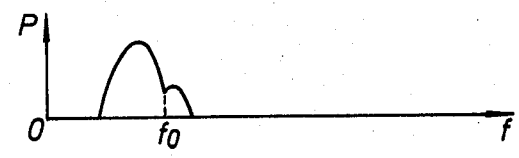
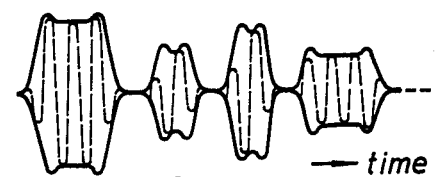
FIG. 12C
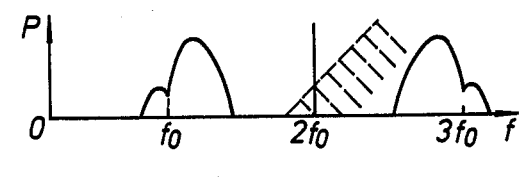
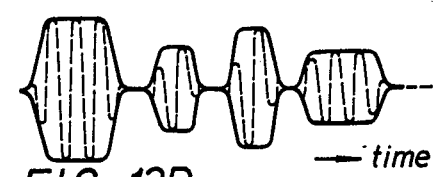
FIG. 12D
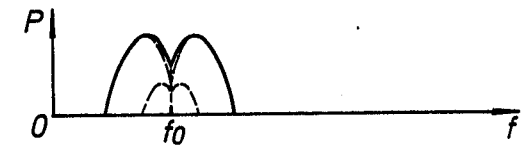
FIG. 15A
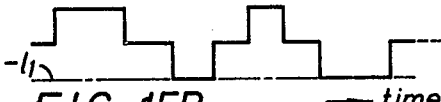
FIG. 15B
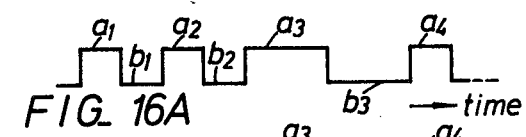
FIG. 16A
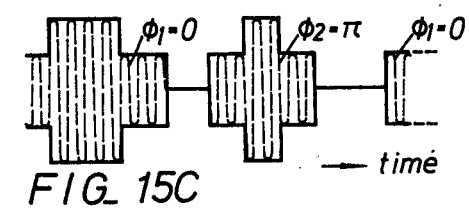
FIG. 15C
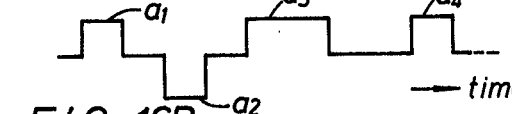
FIG. 16B
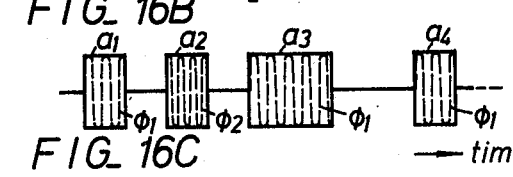
FIG. 16C
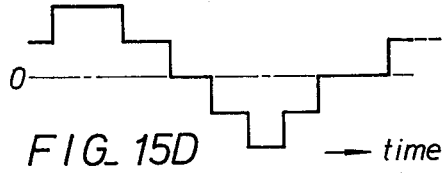
FIG. 15D

४,१६६,९२३

AMPLITUDE- AND PERIODIC PHASE-MODULATION TRANSMISSION SYSTEM

BACKGROUND OF THE INVENTION

The invention relates to a system for transmission, by the modulation of a carrier, of a train of unipolar signals, such as facsimile signal or similar data signal, which alternately assume a definite voltage level, e.g., a black level or mark level, and an arbitrary voltage level of one polarity which differs from the definite level; and more particularly, the invention relates to an efficient transmission system capable of transmission with a transmission bandwidth which is less than that required for the normal amplitude modulated double sideband transmission system.

Heretofore, a facsimile signal or a similar unipolar signal has been transmitted by the amplitude modulated double sideband transmission system or frequency modulation system. These modulation systems require a transmission frequency bandwidth which is at least twice the frequency bandwidth of the original signal. A band compression modulation system is also known in which the original signal is converted into a multi-level signal to provide the band compression, followed by an amplitude or frequency modulation with the multi-level signal, thus forming the multi-level modulation system. Because of the multi-level amplitude, this system is susceptible to the influence of any degradation in signal to noise ratio or the waveform distortion over the transmission path, thereby degrading the received waveform. A vestigial sideband transmission system is also known as another band compression modulation system. In this system, filter means is required for shaping the vestigial sideband frequency characteristic, and also a carrier re-generator for synchronous detection is required on the receiving side, both of which add to the complexity of the overall system.

U.S. Pat. No. 3,761,610 issued to R. E. Krallinger et al and entitled High Speed Facsimile Systems discloses the conversion of a facsimile signal into a three level signal to reduce the bandwidth to nearly one-half, and the latter signal is used to provide a balanced modulation of a carrier, the modulation output being transmitted in the form of a vestigial side-band signal. On the receiving side, the carrier is regenerated for the purpose of synchronous detection of the received signal to demodulate it into the three-level signal, which is then converted into the two-level signal, thus deriving the original signal. In this system, the frequency bandwidth is reduced to about one-half that of the original signal as a result of the conversion into the three level signal, and additionally the use of the vestigial sideband transmission further compresses frequency bandwidth. However a converter for conversion into the three level signal must be provided together with a filter for shaping the vestigial sideband frequency characteristic. Also on the receiving side, there must be some means for extracting the carrier and the synchronous detector as well as another converter for converting the three level signal into the two level signal, thus adding the complexity of the overall arrangement.

It is an object of the invention to provide an efficient transmission system of a relatively simple arrangement which requires less transmission bandwidth than the amplitude modulated double sideband transmission system.

It is another object of the invention to provide an efficient transmission system having a simplified arrangement for the modulator and the demodulator and which achieves a comparable band compression effect as that obtained when the signal is converted into the multi-level signal.

It is a further object of the invention to provide an efficient transmission system which eliminates the conversion into the multi-level signal and thus is insensitive to the influence of level fluctuations and noises than the transmission involving the multi-level conversion, and which still achieves the comparable band compression effect as the latter.

It is still another object of the invention to provide an efficient transmission system which enables the use of a receiver circuit of the same type as a conventional receiver used for the amplitude modulation system employing the envelope detection and which is compatible with the conventional amplitude modulated double sideband transmission system.

It is a still further object of the invention to provide an efficient transmission system which enables the original signal to be reconstructed, by utilizing a phase information, even when the waveform of the envelope is substantially distorted in the transmission path.

It is an additional object of the invention to provide an efficient transmission system which lends itself to construction with a digital circuit.

It is still additional object of the invention to provide a transmission system of an increased efficiency which is achieved by combination with either the multi-level conversion or the vestigial sideband transmission.

SUMMARY OF THE INVENTION

A carrier is amplitude modulated in an amplitude modulator by a train of unipolar signals which alternately assume a reference level and an arbitrary amplitude of one polarity which is either greater or less than the reference level. In accordance with the invention, at least one of the carrier supplied to the amplitude modulator or the modulated carrier is phase modulated in a manner such that each time a unipolar signal of the train occurs, it cyclically assumes one of a plurality of (designated by N, being a positive integer greater than one) discrete phases in a predetermined sequence. As will be demonstrated later, this reduces the transmission frequency bandwidth to one which is substantially equal to that prevailing when a train of unipolar signals is converted into three level signals and then amplitude modulated for transmission. In other words, the frequency bandwidth is compressed as compared with a usual amplitude modulated double sideband transmission system, and if the same frequency bandwidth is used, the transmission rate can be increased. Since the train of unipolar signals is directly used for amplitude modulating the carrier without being converted into the three level signal, the influence of level fluctuations and noises which presents itself as a problem in the two level-three level conversion scheme is minimized. The transmitted signal has the same envelope as the train of original unipolar signals, so that the received signal may be envelope detected on the receiving side to demodulate the original signal, thus achieving the compatibility with a conventional receiver which is suitable for the reception of the amplitude modulated double sideband transmission signal. The phase of the carrier signal also conveys information of the unipolar signals, so that the combination of the phase discrimination of the received carrier signal and the envelope detection permits the original signal to be reconstructed if the amplitude waveform is substantially distorted over the transmission path. To provide the phase modulated carrier signal, pulses having a frequency which is 2 N times the carrier frequency are passed through a frequency divider which divides the pulse frequency by a factor of 2 N. Those of the output terminals associated with the respective pulse outputs from the frequency divider which provide a separation of N pulses therebetween are combined into pairs. On the other hand, the train of unipolar signals is waveform shaped and passed to a divide-by-N frequency divider, N output terminals of which are brought into cooperative relationship with the N pairs of terminals mentioned above for forming a logical product thereof, thus producing a phase modulated output. In this manner, a phase modulator for the carrier can be simply constructed with a digital circuit.

Brief Description of the Drawings

FIGS. 1A to 1C show the waveforms for illustrating the principle of the transmission system according to the invention as applied to the transmitting side;

FIGS. 4A to 4F are a series of waveforms for illustrating the effect of the invention;

FIG. 5 is a block diagram of one embodiment of the equipment used on the transmitting side for the transmission system of the invention;

FIG. 8 is a block diagram of another embodiment of the equipment on the transmitting side of the transmission system of the invention;

FIGS. 9A to 9C show waveforms which illustrate the operation on the receiving side of the invention;

FIGS. 12A to 12D show waveforms on the transmitting and receiving sides and associated spectral power curves when the vestigial sideband transmission is employed;

FIGS. 13A to 13D are a series of waveforms illustrating the receiving system which utilizes the phase information;

FIGS. 15A to 15D are a series of waveforms illustrating an arrangement in which the multi-level conversion is utilized on the transmitting side; and FIGS. 16A to 16C are a series of waveforms illustrating an adaptive modification of the phase modulation.

DETAILED DESCRIPTION OF EMBODIMENTS

A facsimile signal or similar unipolar signal to be transmitted is illustrated in FIG. 1A as alternately assuming a definite voltage level "$l_1$" and a unipolar signal "a" having an arbitrary amplitude which is greater than the voltage level "$l_1$". In FIG. 1B, the signals having the fixed voltage level $l_1$ are designated as $b_1, b_2 \ldots b_N, b_1,$ $b_2 \ldots$ in the sequence they appear, while the unipolar signal "a" is similarly designated as $a_1, a_2 \ldots a_N, a_1, a_2$ $\ldots$, thus cyclically dividing the unipolar signals "a" into groups of N signals. In the transmission system according to the invention, this train of unipolar signals is used to amplitude-modulate a carrier, the modulated carrier being shown in FIG. 1C. Specifically, the modulated carrier has an envelope amplitude which corresponds to the respective amplitudes of the divided signals $a_1, a_2 \ldots a_N, a_1, a_2 \ldots$, but it is to be noted that the phase of the carrier within the envelope does not remain constant, but cyclically assumes different phases of $\phi_1$, $\phi_2 \ldots \phi_N, \phi_1, \phi_2 \ldots \phi_1 \ldots \phi_N$ which represent predetermined discrete values, for example, sequentially displaced in phase by $2\pi/N$. It is to be noted that the phase difference need not be constant, but may either increase or decrease.

Figure 2:
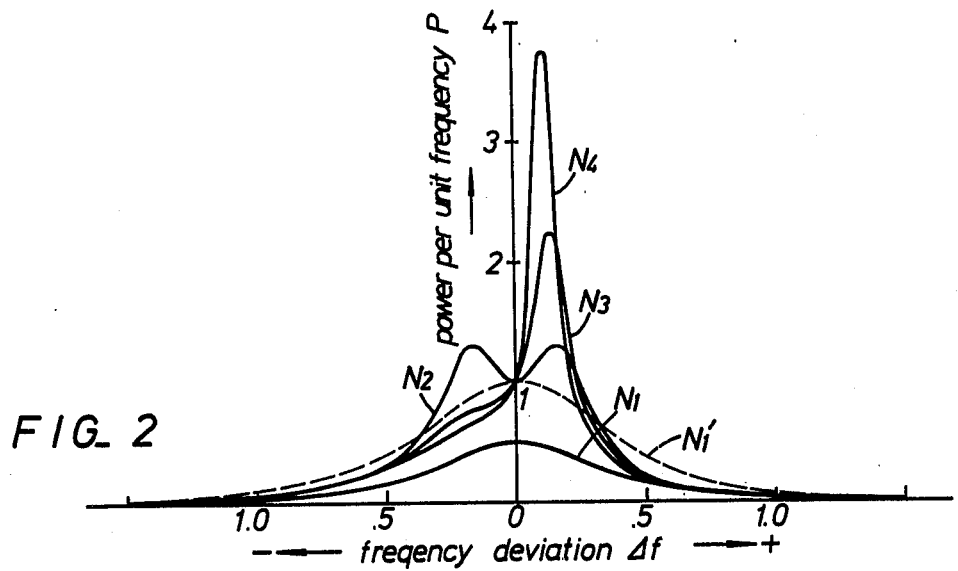
FIG. 2 shows a series of characteristic curves illustrating the spectral power density functions.

The waveform shown in FIG. 1C represents the transmitted waveform according to the efficient transmission system of the invention in which the bandwidth of the transmitted waveform is reduced as compared with the amplitude modulated double sideband transmission system. More specifically, FIG. 2 shows a spectral power density function when a carrier is modulated by a facsimile signal, assuming a Poisson distribution for the provability of changing mark or space of the facsimile signal and calculating the auto-correlation function of the modulated signal, which is subjected to a Fourier transformation to derive the spectral power density function. The abscissa represents a frequency deviation $\Delta f$ from the carrier frequency in units of the reciprocal of the average time interval (second) between the changing points while the ordinate represents the power "p" per unit frequency. A curve $N_1$ corresponds to $N-1$, thus representing the continuous component of the spectral power density function for the amplitude modulated sideband signal. In addition, there is a carrier spectrum bearing no information at $\Delta f=0$. The continuous component is normalized to a curve $N_1'$. Curves $N_2$, $N_3$ and $N_4$ correspond to $N=2$, 3 and 4, respectively, where the phase is incremented by $2\pi/N$. It will be noted that as compared with the curve $N_1'$, these curves are much more concentrated near $\Delta f=0$ or the carrier frequency, thus indicating that the bandwidth is compressed. For a value of N greater than 3, the spectral power density function is biased to the positive direction because of a variation of the phase $\phi_1, \phi_2 \ldots \phi_N$ of the carrier in a leading direction, each time by $2\pi/N$. If the successive phases are varied in a lagging direction, the density function will be biased in the negative direction, but with a comparable band compression effect.

Figure 3A:
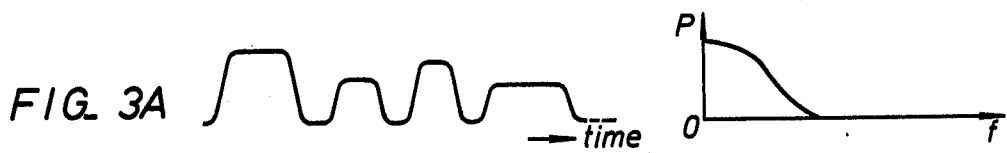
FIGS. 3A to 3E are a series of waveforms for illustrating the effect of the invention and associated spectral power curves.
Figure 3B:
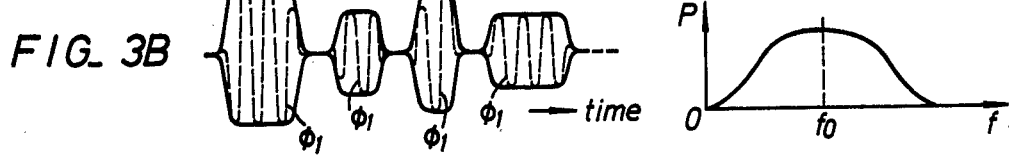
Figure 3C:
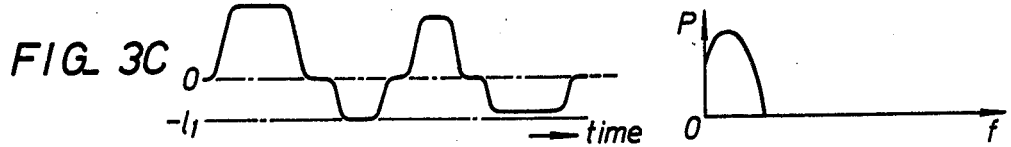
Figure 3D:
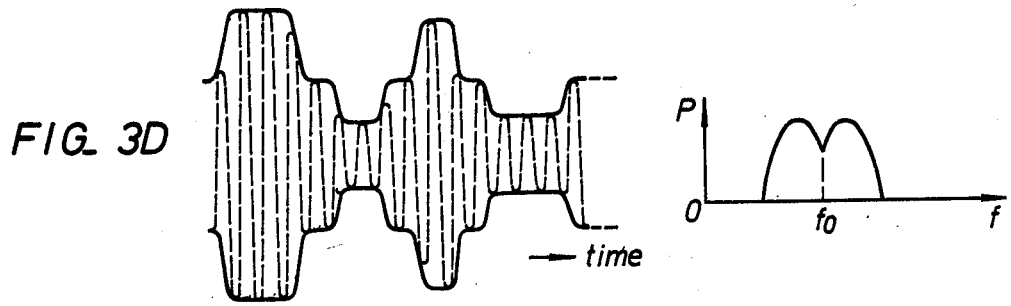
Figure 3E:
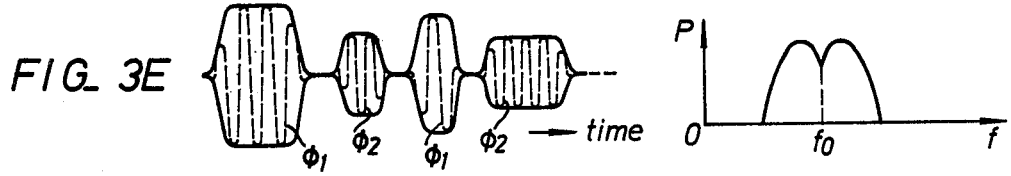

The band compression effect can be easily understood from the following illustration which is given for an arrangement of $N=2$. FIG. 3A shows a train of signals to be transmitted on the left-side with an associated typical spectral power distribution on the right-hand side. In these Figures, "t" in the left-hand graph represents time, while "f" in the right-hand graph represents the frequency and "p" the power density. When the signal is amplitude modulated, there will be obtained a waveform as shown on the left-hand side of FIG. 3B where the carrier contained in the envelope comprise a continuous carrier of a same phase $\phi_1$. The corresponding spectral distribution is indicated on the right-hand side of FIG. 3B where it will be noted that the spectrum of the modulated wave has the same spectral spread as the spectrum of the original signal on either side of the carrier frequency $f_0$ and thus has twice the bandwidth of the original signal as centered on $f_0$. When alternate unipolar signals of FIG. 3A are inverted in polarity and thus converted into three level signals as indicated on the left-hand side of FIG. 3C, the resulting spectrum will be compressed to nearly one-half, as shown on the right-hand side of this Figure. When the converted signal is used to amplitude-modulate a carrier, there will be produced a modulated wave as shown on the left-hand side of FIG. 3D, and the resulting spectrum will be centered on the carrier frequency $f_0$, but has a spreading which is nearly one-half that of FIG. 3B. When the carrier of a definite amplitude is subtracted from the waveform shown in FIG. 3D, there will result an envelope as shown in FIG. 3E which is identical with the amplitude modulated waveform shown in FIG. 3B, but in which the carrier has alternate phases of $\phi_1$ and $\phi_2$, for example, 0° and 180°. This corresponds to an arrangement of N=2 in the transmission system of the invention. It follows therefore that the spectral distribution for the waveform of FIG. 3E represents a suppression of the carrier spectrum from the three-level modulated signal of FIG. 3D, which is equivalent to the spectral distribution shown on the right-hand side of FIG. 3E, and thus is compressed in bandwidth as compared with the waveform of FIG. 3B.

A similar description applies for an arrangement of N=4. Specifically, unipolar signals $a_1$, $a_2$, $a_3$ and $a_4$ to be transmitted, as shown in FIG. 4A, are alternately separated into two trains of unipolar signals as shown in FIGS. 4B and C. Since the time intervals between variations in the waveforms of the respective unipolar signals are increased by a factor of two as compared with the original waveform shown in FIG. 4A, it will be understood that the spectral bandwidth is reduced. The unipolar signals shown in FIGS. 4B and C are subjected to a modulation procedure in accordance with the invention as mentioned in connection with FIG. 3, thereby producing waveforms shown in FIGS. 4D and E. However, it should be noted that the phase of the carrier for the waveform of FIG. 4B differs by 90° relative to that for the waveform of FIG. 4C. Thus, the phases $\phi_1$, $\phi_3$ of the carrier shown in FIG. 4D may be 0° and 180°, for example, while the phases $\phi_2$, $\phi_4$ of the carrier shown in FIG. 4E may be 90° and 270°, respectively. In this manner, the signals shown in FIGS. 4D and E satisfies the phase quadrature requirement, and when they are combined together, there results a waveform as shown in FIG. 4F which represents the waveform of the transmitted signal according to the invention for N=4, with the corresponding spectral distribution being the combination of the spectrums for the waveforms shown in FIGS. 4D and F. It will be understood that the spectral distribution of the composite waveform is compressed to less than one-half the bandwidth of the spectrum for the modulated wave shown in FIG. 3B. In this manner, the invention permits the frequency bandwidth to be compressed. If the value of N is increased to infinity, the result is equivalent to no change in the phase of the carrier, reducing to the same wave which is obtained by the conventional amplitude modulation. Consequently, it will be appreciated that what is significant is to increase N concomitant with the requirement for the phase resolution in the signal transmission system, and no effect is achieved if the value of N is increased beyond such limit.

Figure 6A:
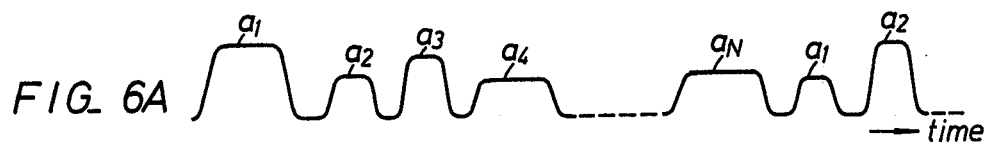
FIGS. 6A to 6G show the waveforms of various signals appearing in the equipment of FIG. 5.
Figure 6B:
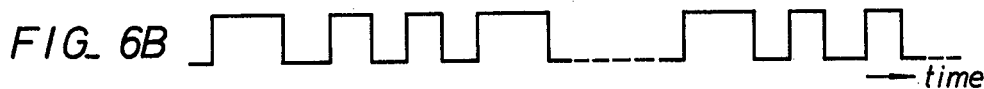
Figure 6C:
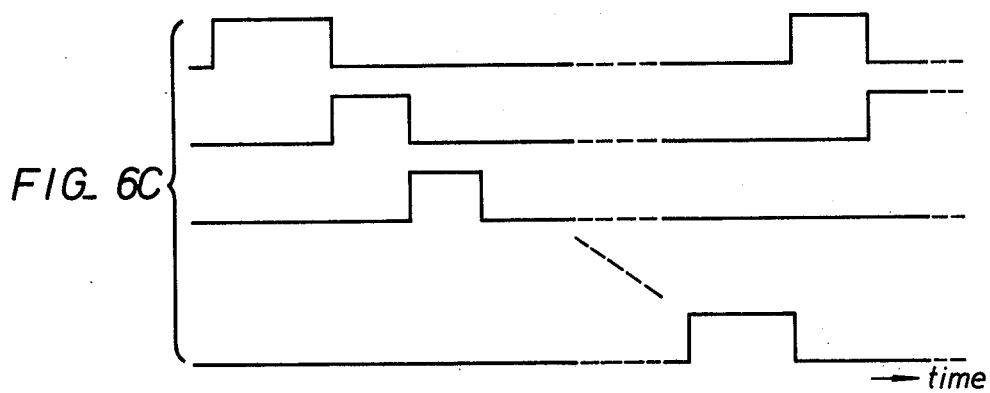
Figure 6D:
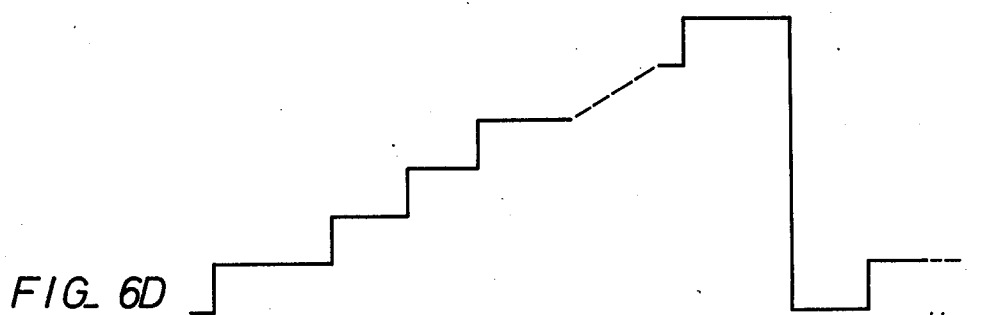
Figure 6E:
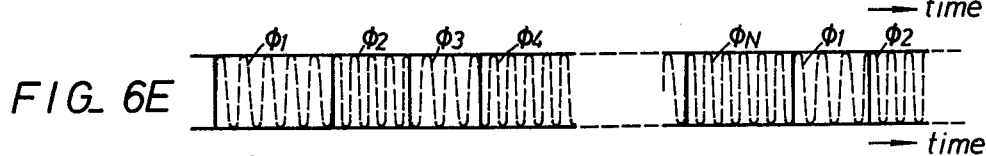
Figure 6F:
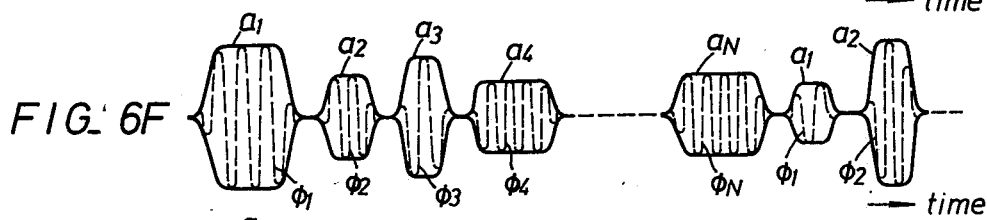

FIG. 5 shows one embodiment of the equipment for forming the above mentioned transmitted signal. Signals appearing in various parts of FIG. 5 are illustrated in FIG. 6. A source of unipolar signals 1 supplies a train of unipolar signals, as depicted in FIG. 6A, to a detector or discriminator 2, which may comprise a Schmitt trigger circuit, for example, which detects that the input signal is above a given level, as illustrated in FIG. 6B. The detected unipolar signals are supplied to a status distributor 3, which sequentially distributes the respective input signals to one of N status. It may be formed as a divide-by-N frequency divider having N output terminals, such as a ring counter. In this instance, an output terminal at which an output is obtained will be sequentially shifted by one for each input, as shown in FIG. 6C, thus completing one cycle with N inputs. Alternatively, the distributor may be arranged such that for each input from the detector or discriminator 2, the voltage level is increased by one step and returned to the initial level after stepping through N voltage levels, as illustrated in FIG. 6D. The output of the status distributor 3 is connected with a carrier generator 4 for controlling the phase thereof so that carriers having a selected one of N phases corresponding to N status of the input are generated, as shown in FIG. 6E. Such phase control can be accomplished by utilizing a four-phase modulator, an eight-phase modulator or similar means which delivers a carrier of given phase depending on the input data, as is well known in the data communication art. In this manner, the carrier is phase modulated so as to cyclically assume one of N phases for each unipolar signal of the input train, and the modulated output is supplied to an amplitude modulator 5. The modulator 5 also receives the train of unipolar signals from the source 1 as a modulation signal, and the phase modulated carrier is amplitude modulated by the unipolar signal. The amplitude modulation in the modulator 5 takes place by a timing adjustment such that the points at which the phase of the phase modulated carrier changes are in coincidence with the points at which the amplitude of the unipolar signal changes. However, this is not absolutely necessary, the only requirement being that a change in the phase occurs during the period when the amplitude is zero. It will be thus understood that a transmitted signal as illustrated in FIG. 1C or FIG. 6F is obtained at the output terminal 6 of the amplitude modulator 5 for the transmission system of the invention.

Figure 7:
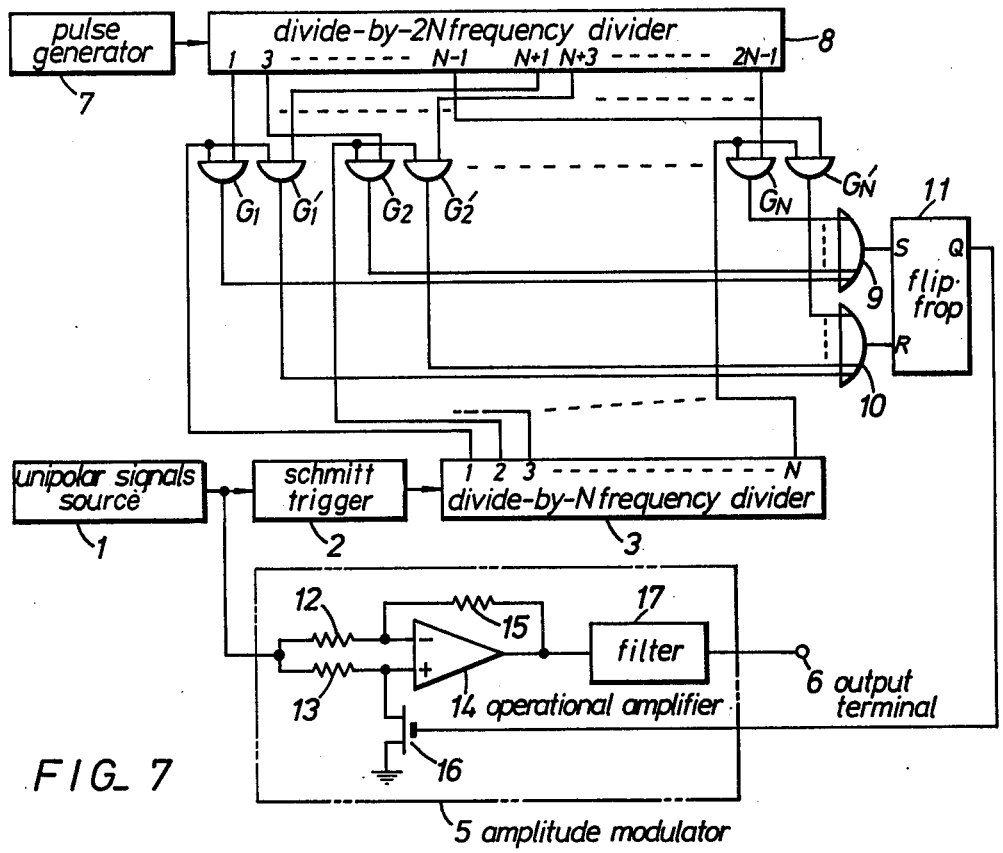
FIG. 7 is a schematic electrical diagram showing a specific example of certain circuits used in FIG. 5.

FIG. 7 shows a specific example of the modulator which is constructed as a digital circuit. In FIG. 7, corresponding parts to those of FIG. 5 are designated by like reference numerals. The unipolar signal which passed through the discriminator 2 is supplied to the divide-by-N frequency divider 3 which functions as the status distributor. There is provided a pulse generator 7 which produces pulses of a frequency which is 2N times the desired carrier frequency $f_0$, and the pulses therefrom are supplied to a divide-by-2N frequency divider 8. The outputs from the output terminals of the frequency divider 3 which are numbered 1 to N are supplied to AND circuits $G_1$ to $G_N$, respectively, which also receive the output from the output terminals of the frequency divider 8 which are numbered 1, 3, 5 . . . 2N−1, respectively, thereby forming a logical product thereof. In addition, AND circuits $G_1'$ to $G_N'$ form a logical product of the respective output from the output terminals 1 to N of the frequency divider 3 and the outputs from the output terminals N+1, N+3, N+5 . . . N−1 of the frequency divider 8, or the output terminals thereof which are spaced by N terminals from the first mentioned output terminals numbered 1, 3, 5 . . .

2N−1. The output from these AND circuits $G_1$ to $G_N$ are passed through an OR circuit 9 to the terminal of a flipflop 11, while the outputs from the AND circuits $G_1'$ to $G_N'$ are passed through an OR circuit 10 to the reset terminal of the flipflop 11.

As a consequence, when the discriminated output corresponding to the unipolar signal $a_1$ (FIG. 6A) is supplied to the frequency divider 3, an output occurs only at the first output terminal thereof and is supplied to AND circuits $G_1$ and $G_1'$, so that the flipflop 11 will be set each time an output is obtained at the first output terminal of the frequency divider 8 and will be reset each time an output is obtained at the (N+1)-th output terminal, the flipflop 11 being set and reset at the carrier frequency $f_O$. The phase of the carrier signal which is produced at the set output terminal of the flipflop 11 at this time is designated as $\phi_1$. Subsequently when the discriminated output corresponding to the unipolar signal $a_2$ is supplied to the frequency divider 3, an output will be obtained only at the second output terminal thereof and will be supplied to the AND circuits $G_2$ and $G_2'$, so that the flipflop 11 will be set each time an output is obtained at the third output terminal of the frequency divider 8 and will be reset each time an output is obtained at the (N+3)-th output terminal. The carrier signal which is now produced at the set output terminal of the flipflop 11 will have a different phase, $\phi_2$, which legs behind $\phi_1$ by $2\pi/N$. In the similar manner, every time a discriminated output of a unipolar signal is supplied to the frequency divider 3, the flipflop 11 produces a carrier signal of a phase which sequentially lags by $2\pi/N$. In this manner, a phase modulated carrier signal is produced with a digital circuit, which can be easily constructed as an integrated semiconductor circuit.

The amplitude modulation of the phase modulated carrier from the flipflop 11 by the unipolar signal takes place by applying the train of unipolar signals from the source 1 to the inverting and non-inverting input terminals of a differential, operational amplifier 14 through resistors 12 and 13, respectively. A negative feedback resistor 15 is connected across the output terminal and the inverting input terminal of the amplifier 14, and the non-inverting input terminal of the amplifier 11 is connected to the ground through a source-drain path of a field effect transistor 16 which functions as a switching element. The set output of the flipflop 11 is supplied to the gate of the transistor 16. Assuming that the resistors 12, 13 and 15 have respective resistances of 2R, R and 2R, respectively, and the unipolar signal has an amplitude $E_1$, the transistor 16 will conduct to connect the non-inverting input terminal of the amplifier 14 to the ground when the output from the flipflop 11 is in its high level or "1", thereby producing an output of $-E_1$ at the output terminal of the amplifier. When the output from the flipflop 11 is in its low level or "0", the transistor 16 remains non-conductive, whereby the output from the amplifier 14 will be $+E_1$. Thus, there is obtained at the output of the amplifier 14 a carrier which is amplitude modulated by $E_1$. This output is passed through a filter 17 to eliminate higher harmonics, thereby producing an output, as shown in FIG. 1C, at the output terminal 6. It will be noted that any desired sequence of phases can be achieved by choosing a suitable combination of the output terminals numbered 1 to N of the frequency divider 3 and the output terminals numbered 1 to (2N−1) and (N+1) to (N−1) of the frequency divider 8.

Figure 6G:
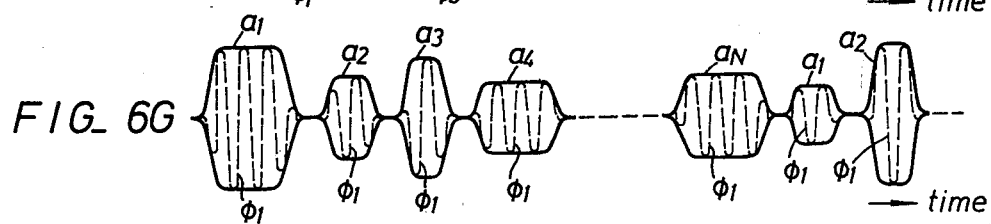

It will be understood that the carrier may be initially amplitude modulated by the train of unipolar signals, and the modulated output then phase modulated. Such an arrangement is shown in FIG. 8 wherein the carrier of a fixed phase supplied from the carrier generator 3 is amplitude modulated in the amplitude modulator 5 by the train of unipolar signals (FIG. 6A) supplied from the source 1, generally in the same manner as illustrated in FIG. 6G. The modulated output is supplied to a phase modulator 20 where a phase modulation takes place to cause it to assume one of N phases cyclically, as shown in FIG. 6F, depending on the N status (FIG. 6C or D) of the status distributor 3. For N=2, the phase modulator 20 may be replaced by a phase inverter.

Figure 10:
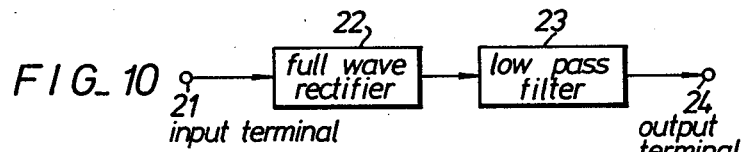
FIG. 10 is a block diagram of the equipment used on the receiving side.

The transmitted signal which is formed as described above can be demodulated on the receiving side as mentioned below. As illustrated in FIG. 1C or FIG. 6F, the envelope of the transmitted signal of the invention corresponds to that of the train of the unipolar signals, so that even though the received signal may be influenced by the characteristics of the transmission path to result in a distortion in the waveform of the envelope, as illustrated in FIG. 9A, the train of original unipolar signals is retained in the amplitude information. Thus, if the received signal is subjected to a full wave rectification to form a waveform as illustrated in FIG. 9B and then passed through a low pass filter, the train of original unipolar signals can be demodulated, as shown in FIG. 9C. In other words, an envelope detector which is usually employed as a demodulator for the amplitude modulated double sideband transmission signal can be used for demodulation. By way of example, FIG. 10 illustrates that the received signal from an input terminal 21 is rectified in a full wave rectifier 22 and then passed through a low pass filter 23 to produce a demodulated output at an output terminal 24. With the transmission system according to the invention, the envelope information of the transmitted signal can be directly demodulated while preserving insusceptibility to distortion over the transmission path, by virtue of the band compression.

Figure 11:
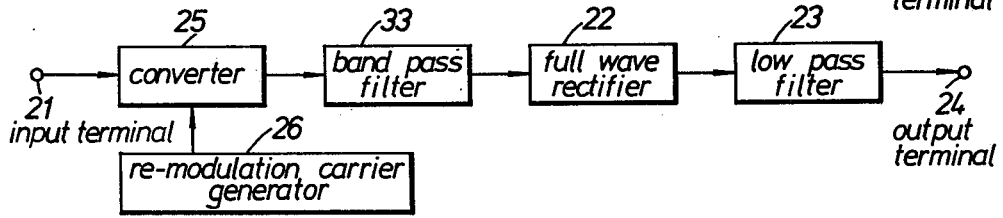
FIG. 11 is a block diagram of another embodiment of the equipment used on the receiving side.

In order to avoid the interference of harmonic components upon the high frequency components of the signal during the full wave rectification process, remodulation detection may be employed as is customary. Specifically, FIG. 11 shows that the received signal from the terminal 21 is fed to a converter 25 which shifts it to a frequency band which is at least four times higher than the maximum frequency in the train of unipolar signals, by utilizing a carrier from a remodulation carrier generator 26. Only the shifted component or a re-modulated single sideband component is passed through a band pass filter 33, the output of which is envelope detected in the similar manner as illustrated in FIG. 10.

While in the above description, the double sideband transmission is utilized in combination with the envelope detection on the receiving side in order to extract the envelope information, it is also possible to extract the envelope information on the receiving side by utilizing the vestigial sideband transmission. FIG. 12A illustrates the same waveform and spectrum as illustrated in FIG. 3E for two phase arrangement (N=2). The wave is shaped by passing it through a vestigial sideband filter having an attenuation characteristic illustrated by dotted lines on the right-hand side of FIG. 12A, thereby producing a vestigial sideband illustrated in FIG. 12B. If the waveform is directly transmitted, the envelope information will be distorted because of the quadrature components. In addition, the shaping of the vestigial sideband causes a transition from the dotted line to the solid line response on the right-hand side of FIG. 12B, resulting in a loss of the majority of the upper sideband and the high frequency region of the lower sideband. If a synchronous detection is simply applied on the receiving side, there will result a three-level waveform as illustrated in FIG. 3C, thus undesirably requiring the three-level to two-level conversion.

By contrast, the received wave may be subjected to full wave rectification on the receiving side to extract twice the original carrier frequency, $2 f_O$, which can be used in a synchronous detection to produce a waveform as shown in FIG. 12C. The use of the double frequency is preferred since no carrier component $f_0$ is present in the waveform of FIG. 12A, B, but $2 f_0$ component is present in a rectified waveform of FIG. 12A or B. By eliminating the upper sideband of the resulting waveform which is demodulated by using the double frequency, and synthesizing the lower sideband with the vestigial sideband received signal shown in FIG. 12B, there is reconstructed the original spectral distribution of FIG. 12A, as illustrated in FIG. 12D, thus obtaining the original envelope waveform. The resulting waveform can be envelope detected to extract the original information. In this manner, the vestigial sideband transmission can be utilized in the invention to faithfully reproduce the original modulated waveform on the receiving side, which can then be subjected to a full wave rectification to extract the envelope information. Such a combined use of the vestigial sideband transmission enables a more efficient transmission. In this instance, an adaptor comprising means for extracting twice the carrier frequency, means for demodulating and means for synthesizing may be provided as a stage preceding a conventional receiver of envelope detection type to thereby produce the original unipolar signals.

Figure 14:
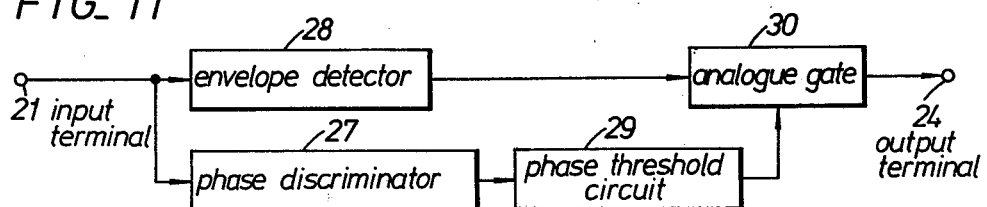
FIG. 14 is a block diagram of a receiver circuit for the receiving system illustrated in FIG. 13.

Since information is also contained in the phase of the carrier signal in the transmission signal according to the invention, such information can be utilized for demodulation. This scheme assures a reliable demodulation in the presence of a severe band limiting effect of the transmission path. Specifically, FIG. 13A illustrates that the band limiting effect of the transmission path causes the transmitted wave, as illustrated in FIG. 1C, to be more severely distorted in its envelope waveform than the waveform shown in FIG. 9A. The received signal is supplied from the input terminal 21 (FIG. 14) to a phase discriminator 27 and an envelope detector 28. The phase discriminator 27 derives voltage outputs $V_1$ to $V_N$ which correspond to the phase $\phi_1$ to $\phi_N$ of the carrier, as shown in FIG. 13B. The output of the phase discriminator 27 is supplied to a phase threshold circuit 29 which produces an "1" output when the voltage is within a range of $\pm \Delta V$ from the established values of the voltage levels $V_1$ to $V_N$ and otherwise produces "0" output, thus producing a train of pulses corresponding to the individual unipolar signals in the original train, as illustrated in FIG. 13C. Alternatively, the input voltage may be coded into 2N status in binary fashion, and the lowest digit may be outputted as a signal. The output of the threshold circuit 29 controls to open or close an analogue gate 30 for controlling the passage of the output from the envelope detector 28, thus producing a demodulated output at a terminal 24, as shown in FIG. 13D.

Since the unipolar signals in the train may have any amplitude of one polarity relative to the definite value, a train of unipolar signals as illustrated in FIG. 15A may be converted into three level signals shown in FIG. 15B, and the lowest level $-l_1$ may be chosen as a zero level to define a new train of unipolar signals, which can be utilized to amplitude and phase modulate a carrier as shown in FIG. 15C, thereby further reducing the bandwidth by one-half. Specifically, the spectrum for the signal of FIG. 15B is compressed to nearly one-half that of the signal shown in FIG. 15A. When the signal shown in FIG. 15B is converted into five level signals as illustrated in FIG. 15D, and the latter signal is used in a balanced modulation of a carrier having a fixed phase, the resulting modulated output has a waveform which coincides with that shown in FIG. 15C. The spectrum for the signal of FIG. 15D is further reduced to nearly one-half the spectrum for the signal shown in FIG. 15B. As a consequence, the spectrum for the signal of FIG. 15C has a spreading corresponding to the spectrum for the signal of FIG. 15D about the carrier frequency. In other words, the band compression effect described previously in connection with FIG. 3 is doubled.

The cyclic modulation of the phase of the carrier by the unipolar signals can be modified in an adaptive manner, depending on the status of the unipolar signals in the train. Thus, instead of simply inverting the unipolar signals alternately in the three level conversion, the polarity may be inverted when the length of the definite value signal which preceds a particular unipolar signal represents an odd number of picture elements, but no inversion takes place when that signal represents an even number of picture elements, which is known as the duo-binary system. Such system can be applied to the present invention, by using the rule of polarity inversion for the control of the phase of the carrier. By way of example, in a train of unipolar signals shown in FIG. 16A, each length of the fixed value signals $b_1$, $b_2$ represents a single picture element, whereas the length of the fixed value signal $b_3$ represents two picture elements. When conversion according to the duo-binary system is effected, the unipolar signal $a_4$ which immediately follows the even number picture elements or the signal $b_3$ is not inverted, as depicted in FIG. 16B. Such rule may be applied to the present invention as illustrated in FIG. 16C, wherein it will be noted that the phase $\phi_1$, $\phi_2$ of the carrier does not always alternate with each other for successive unipolar signals, but the unipolar signal $a_4$ which follows the signal $b_3$ having a length which represents an even number of picture elements is not modified in its phase, thus assuming the same phase $\phi_1$ as the preceding signal.

It will be appreciated that the multi-level conversion, the vestigial sideband transmission and the adaptive modification of the phase modulation can be used in any combination to provide an efficient transmission.

Having described the invention, what is claimed is:

1. An efficient transmission system comprising:
   a source of unipolar signals which alternate between a fixed reference value and arbitrary amplitudes having the same polarity relative to the reference value;
   circuit means, connected to said source of unipolar signals, for sequentially assuming one of predetermined N statuses, independent of said amplitude, each time an individual unipolar signal is obtained;
   phase modulator means connected to said circuit means for generating a carrier having one of predetermined N phases in response to each status of said circuit means; and amplitude modulator means connected to said source for amplitude modulating said phase modulated carrier with the train of unipolar signals.

2. An efficient transmission system according to claim 1, in which the phase modulator means comprises a first circuit for detecting the individual unipolar signals of the train, a second circuit which assumes one of N statuses sequentially each time a detected output is obtained from the first circuit, and a third circuit for producing a carrier having one of the predetermined N phases in response to each status of the second circuit.

3. An efficient transmission system according to claim 1, further including means for receiving the phase and amplitude-modulated carrier, and means for detecting envelope information from the received carrier.

4. An efficient transmission system according to claim 3, further including a first circuit for discriminating the phase of the received carrier, a second circuit for converting the discriminated output from the first circuit into a two-level signal in response to a given change in the level of the discriminated output, a third circuit for controlling the amplitude of the two-level output signal in accordance with the detected envelope information.

5. An efficient transmission system according to claim 3 in which said means for detecting the envelope information comprises an envelope detector.

6. An efficient transmission system according to claim 1, further including means for adaptively modifying the relationship between the unipolar signals and the associated N phases in the phase modulator means in accordance with the time interval between adjacent ones of the unipolar signals in the train.

7. The efficient transmission system according to claim 11, wherein said phase modulator means comprises a pulse generator for producing pulses of a frequency which is 2N times the carrier frequency, a first frequency divider which frequency divides the pulses by 2N and has first and second sets of N output terminals to derive therefrom outputs displaced apart in phase by one-half of the frequency-dividing period, a second frequency divider which provides one of N states cyclically for each occurrence of unipolar signals and has N output terminals corresponding to the N states, a first set of N AND circuits for producing the logical product of each of the outputs from the N output terminals of the second frequency divider and each of the outputs from said first set of N output terminals of the first frequency divider, a second set of N AND circuits for producing the logical product of each of the outputs from the N output terminals of the second frequency divider and each of the outputs from said second set of N output terminals of the first frequency divider, a first OR circuit for producing the logical sum of the outputs from the first set of N AND circuits, a second OR circuit for producing the logical sum of the outputs from the second set of N AND circuits, and a flip-flop set by the first OR circuit and reset by the second OR circuit to thereby produce carriers having N different phases.

8. An efficient transmission system according to claim 1 in which the train of unipolar signals comprise multi-level signals, the minimum or maximum level of which represents the fixed reference value.

9. An efficient transmission system according to claim 1, further including means for transmitting the amplitude and phase modulated carrier in the form of a vestigial sideband signal, and additionally including on the receiving side means for extracting twice the carrier frequency from a received signal, means for modulating the received signal by a carrier having twice the transmitted carrier frequency, means for synthesizing the received signal and the lower side band signal of the modulated signal, and means for envelope detecting the synthesized signal.

10. A method of efficiently transmitting a train of unipolar pulses of varying amplitudes from a transmitting station to a receiving station, and comprising the steps of:

generating a carrier at the transmitting station;

cyclically phase-modulating the carrier at times coinciding with successive unipolar pulses, such that successive phase-modulations follow a fixed sequence of N predetermined different carrier phases which are independent of the amplitudes of the unipolar pulses;

amplitude-modulating the phase-modulated carrier with the train of unipolar pulses; and transmitting the phase- and amplitude-modulated carrier to the receiving station.

* * * * *